United States Patent
Orris

(10) Patent No.: US 8,210,854 B2
(45) Date of Patent: Jul. 3, 2012

(54) ELECTRICAL SOCKET ASSEMBLY FOR ELECTRICALLY CONNECTING ADJACENT CIRCUIT BOARDS

(75) Inventor: David Patrick Orris, Middletown, PA (US)

(73) Assignee: Tyco Electronics Corporation, Berwyn, PA (US)

( * ) Notice: Subject to any disclaimer, the term of this patent is extended or adjusted under 35 U.S.C. 154(b) by 0 days.

(21) Appl. No.: 12/886,069

(22) Filed: Sep. 20, 2010

(65) Prior Publication Data

US 2012/0071009 A1     Mar. 22, 2012

(51) Int. Cl.
*H01R 12/00* (2006.01)

(52) U.S. Cl. ............... 439/65; 439/378; 361/804

(58) Field of Classification Search ............ 439/59, 439/64, 65, 378, 680, 681, 843; 361/803, 361/804, 807, 810
See application file for complete search history.

(56) References Cited

U.S. PATENT DOCUMENTS

| | | | |
|---|---|---|---|
| 5,591,039 A | 1/1997 | Matthews | |
| 5,807,120 A | 9/1998 | Matthews | |
| 6,074,235 A * | 6/2000 | Brandberg et al. | 439/378 |
| 6,618,268 B2 * | 9/2003 | Dibene et al. | 361/787 |
| 6,863,562 B1 * | 3/2005 | Jensen et al. | 439/571 |
| 7,052,319 B1 * | 5/2006 | Chen | 439/595 |
| 7,186,121 B1 * | 3/2007 | Costello et al. | 439/79 |
| 7,258,569 B1 * | 8/2007 | Johnson et al. | 439/378 |
| 7,593,239 B2 * | 9/2009 | Li et al. | 361/807 |
| 7,621,754 B2 * | 11/2009 | Costello | 439/65 |
| 7,887,361 B2 * | 2/2011 | Costello | 439/378 |

* cited by examiner

*Primary Examiner* — Thanh Tam Le

(57) ABSTRACT

An electrical socket assembly including a socket housing having coupling and flange portions and a contact cavity that extends through the coupling and flange portions along a central axis. The coupling and flange portions have different peripheral contours that extend about the central axis. The peripheral contour of the flange portion being sized and shaped to prevent the flange portion from advancing through a thru-hole of a circuit board. The socket assembly also includes a fastener that is configured to be secured to the coupling portion. The fastener and the flange portion have respective mating surfaces that face each other in opposite directions along the central axis. The respective mating surfaces are configured to grip the circuit board therebetween such that the socket housing has a fixed position relative to the circuit board. A conductive path exists between the power contact and the circuit board.

20 Claims, 4 Drawing Sheets

ELECTRICAL SOCKET ASSEMBLY FOR ELECTRICALLY CONNECTING ADJACENT CIRCUIT BOARDS

BACKGROUND OF THE INVENTION

The subject matter herein relates generally to electrical connector assemblies, and more particularly, to socket assemblies configured to electrically join adjacent circuit boards.

In some known electrical systems, an electrical connector assembly may be used to electrically join a pair of circuit boards that are stacked adjacent to each other. For example, a pair of circuit boards may be positioned over and extend parallel to each other with a stack spacing extending therebetween. A connector assembly may be positioned between the circuit boards and mechanically and electrically join the circuit boards. Because the connector assembly is located between the circuit boards within the stack spacing, a minimum height of the stack spacing that separates the pair of circuit boards is required to accommodate the connector assembly. Furthermore, connector assemblies that deliver electrical power between the circuit boards may require larger stack spacings compared to connector assemblies that only transmit data signals. For example, in known electrical systems having connector assemblies that deliver power between the stacked circuit boards, the stack spacings have heights that are greater than 0.5 inches or greater than 1.0 inch. Such stack heights may reduce an amount of available space in the electrical system.

Accordingly, there is a need for a connector assembly that permits shorter stack spacings or heights between circuit boards than known electrical systems. Furthermore, there is a need for alternative connector assemblies that are capable of delivering power between circuit boards stacked with respect to each other.

BRIEF DESCRIPTION OF THE INVENTION

In one embodiment, an electrical socket assembly is provided that is configured to grip a circuit board. The socket assembly includes a socket housing having coupling and flange portions and a contact cavity that extends through the coupling and flange portions along a central axis. The socket housing is configured to electrically engage a power contact that is received by the contact cavity. The coupling and flange portions have different peripheral contours that extend about the central axis. The peripheral contour of the coupling portion is sized and shaped to permit the coupling portion to be inserted through a thru-hole of the circuit board. The peripheral contour of the flange portion is sized and shaped to prevent the flange portion from advancing through the thru-hole of the circuit board. The socket assembly also includes a fastener that is configured to be secured to the coupling portion. The fastener and the flange portion have respective mating surfaces that face each other in opposite directions along the central axis. The respective mating surfaces are configured to grip the circuit board therebetween such that the socket housing has a fixed position with respect to the circuit board. A conductive path exists that electrically connects the power contact and the circuit board. The conductive path transmits through at least one of the respective mating surfaces that grip the circuit board.

Optionally, each of the mating surfaces directly contacts a corresponding one board surface of the circuit board. The mating surface of the fastener presses the circuit board against the mating surface of the flange portion to grip the circuit board therebetween.

In another embodiment, a circuit board assembly is provided that includes first and second circuit boards and an elongated power contact coupled to the first circuit board. The circuit board assembly also includes a socket housing that has coupling and flange portions and a contact cavity that extends through the coupling and flange portions along a central axis. The coupling and flange portions have different peripheral contours that extend about the central axis. The peripheral contour of the coupling portion is sized and shaped to permit the coupling portion to be inserted through a thru-hole of the second circuit board. The peripheral contour of the flange portion is sized and shaped to prevent the flange portion from advancing through the thru-hole of the second circuit board. The circuit board assembly also includes a fastener that is configured to be secured to the coupling portion. The fastener and the flange portion have respective mating surfaces that face each other in opposite directions along the central axis. The respective mating surfaces are configured to grip the second circuit board therebetween such that the socket housing has a fixed position with respect to the second circuit board. A conductive path exists between the first and second circuit boards through the power contact and the socket housing when the power contact is inserted into the contact cavity and electrically engaged to the socket housing. The first and second circuit boards extend substantially parallel to each other and have a stack spacing therebetween.

DETAILED DESCRIPTION OF THE INVENTION

Figure 1:
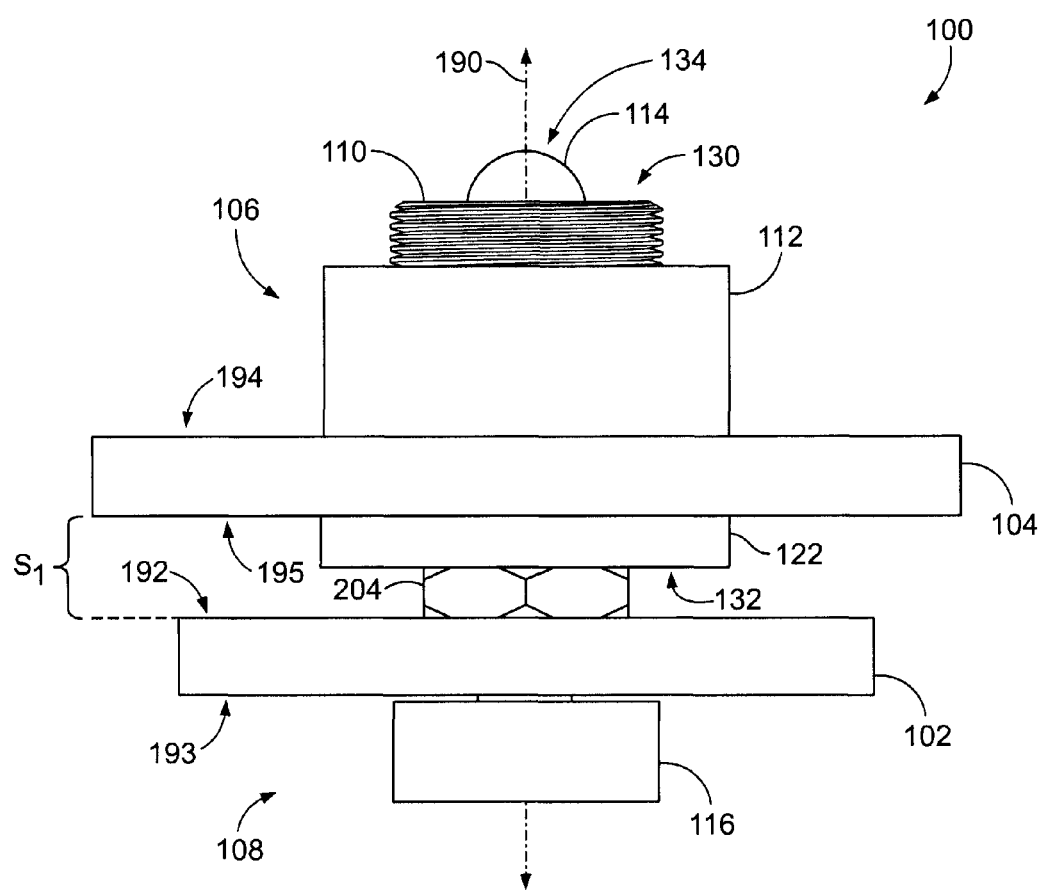
FIG. 1 is a side view of a circuit board assembly formed in accordance with one embodiment.

FIG. 1 is a side view of a circuit board assembly 100 formed in accordance with one embodiment. The circuit board assembly 100 includes first and second circuit boards 102 and 104 that are electrically connected through an electrical socket assembly 106 and a power contact assembly 108. The socket and contact assemblies 106 and 108 may also be referred to as sub-assemblies of the circuit board assembly 100. The socket assembly 106 includes a socket housing 110 and a fastener (or first fastener) 112 that couples to the socket housing 110 to secure or mount the socket housing 110 to the circuit board 104. As shown, the socket housing 110 has a leading end 130, a trailing end 132, and a central axis 190 that extends therebetween. The leading end 130 is configured to be inserted through a thru-hole 230 (shown in FIG. 7) of the circuit board 104. The trailing end 132 is configured to be disposed between the circuit boards 102 and 104.

When the circuit board assembly 100 is fully constructed, the circuit board 104 is positioned between the fastener 112 and a flange portion 122 of the socket housing 110 that includes the trailing end 132. The socket assembly 106 may grip the circuit board 104 and hold the circuit board 104 in fixed position with respect to the socket housing 110. The socket assembly 106 may facilitate in constructing the circuit board assembly 100 and holding the circuit board 104 in a desired orientation during normal operation of the circuit board assembly 100. Also shown, the circuit board 102 has opposite board surfaces (or side surfaces) 192 and 193, and the circuit board 104 has opposite board surfaces (or side surfaces) 194 and 195. Each of the board surfaces 192-195 faces in one direction along the central axis 190.

The contact assembly 108 includes an elongated power contact 114. As shown in FIG. 1, the power contact 114 may extend through the first and second circuit boards 102 and 104 and a contact cavity 160 (shown in FIG. 3) of the socket housing 110 when the circuit board assembly 100 is fully constructed. The contact assembly 108 also includes a fastener (or second fastener) 116 that couples to the power contact 114 to secure the power contact 114 to the circuit board 102. The power contact 114 includes an insert end 134 and a terminal end 136 (shown in FIG. 5) that is configured to couple to the fastener 116. The power contact 114 is configured to be inserted into the contact cavity 160 to establish an electrical connection between the socket housing 110 and the power contact 114. When the power contact 114 is secured to the circuit board 102 and electrically engaged to the socket housing 110, one or more conductive paths may exist from the circuit board 102, through the power contact 114, and through the socket assembly 106 to the circuit board 104. Accordingly, the socket and contact assemblies 106 and 108 may provide an electrical connection for transmitting electrical power between the circuit boards 102 and 104. For example, the socket and contact assemblies 106 and 108 may transmit at least about 35 A.

In addition, the socket and contact assemblies 106 and 108 may permit the circuit boards 102 and 104 to be positioned immediately adjacent to each other. In the illustrated embodiment, the circuit boards 102 and 104 are oriented parallel to each other and have a stack spacing (or height) $S_1$ that exists therebetween. When the circuit board assembly 100 is fully constructed, the socket housing 110, the fasteners 112 and 116, and the power contact 114 may be stacked with respect to one another along the central axis 190 that extends through the socket housing 110. As shown, a mounting feature 204 of the power contact 114 and the flange portion 122 of the socket housing 110 are stacked with respect to each other and disposed between the circuit boards 102 and 104 within the stack spacing $S_1$. The stack spacing $S_1$ may be measured along the central axis 190 between the board surfaces 195 and 192 that oppose each other across the stack spacing $S_1$. The central axis 190 may extend in a direction along the gravitational force or in various other directions, such as perpendicular or oblique to the gravitational force. Furthermore, although not shown, other components or elements may be located between the circuit boards 102 and 104. For example, other fasteners may extend therebetween that are configured to mechanically hold the circuit boards 102 and 104 adjacent to one another.

The stack spacing $S_1$ may be less than a stack spacing or height used by known connector assemblies where circuit boards are stacked adjacent to each other. For example, in particular embodiments, the stack spacing $S_1$ is less than about 0.50 inches between the circuit boards 102 and 104. In more particular embodiments, the stack spacing $S_1$ is less than about 0.25 inches or less than about 0.20 inches. However, in other embodiments, the stack spacing $S_1$ is greater than 0.5 inches or greater than 1.0 inch. The stack spacing $S_1$ may also be similar to a stack spacing or height used by known connector assemblies.

Figure 2:
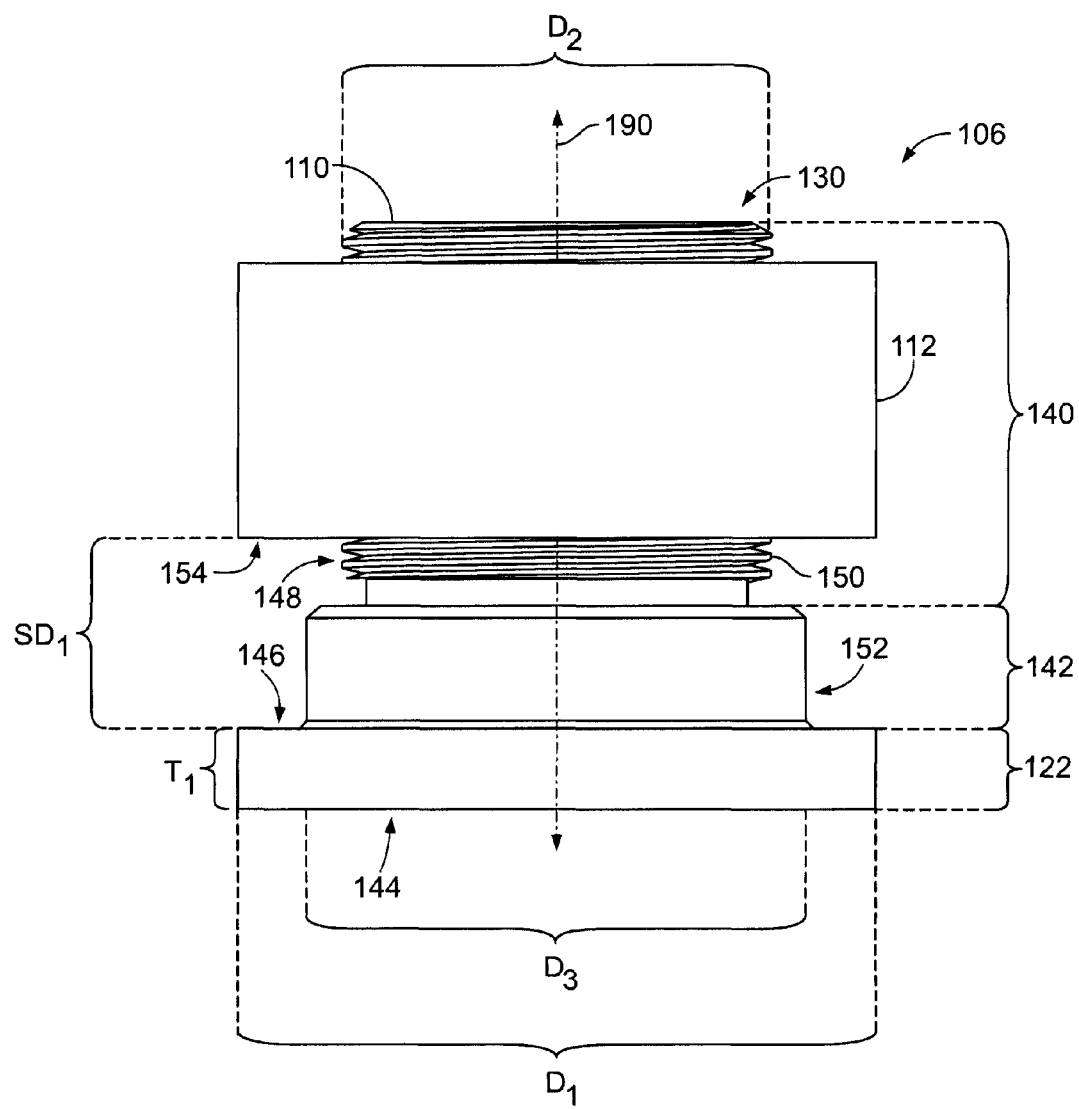
FIG. 2 is a side view of a socket assembly formed in accordance with one embodiment.

FIG. 2 is a side view of the socket assembly 106 formed in accordance with one embodiment. The socket housing 110 includes the flange portion 122, a coupling portion 140, and a shoulder (or intermediate) portion 142 that extends between the coupling and flange portions 140 and 122. The flange portion 122 has a terminating surface 144 and a mating surface 146 that face in opposite directions along the central axis 190. In the illustrated embodiment, the terminating and mating surfaces 144 and 146 extend parallel to each other and the circuit board 104 (FIG. 1). The flange portion 122 has a thickness $T_1$ measured between the terminating and mating surfaces 144 and 146. The flange portion 122 also has an outer diameter $D_1$ that is measured through and perpendicular to the central axis 190.

The coupling portion 140 extends from the shoulder portion 142 toward the leading end 130. The coupling portion 140 has an outer diameter $D_2$ that is measured through and perpendicular to the central axis 190. As shown, the coupling portion 140 also has an exterior surface 148 that is configured to engage the fastener 112. In the illustrated embodiment, the exterior surface 148 is shaped to include outwardly-facing threads 150 that curve about the central axis 190. The fastener 112 may include complementary inwardly-facing threads 248 (FIG. 7) that engage the threads 150 to secure the fastener 112 to the socket housing 110. The socket housing 110 and the fastener 112 may comprise conductive material. As such, a conductive path between the fastener 112 and the socket housing 110 may exist when the fastener 112 is secured thereto. However, the socket assembly 106 may have other mechanisms for securing the fastener 112 to the socket housing 110 and establishing a conductive pathway therebetween. For example, the socket assembly 106 may utilize latches, springs, tabs, grooves, cams, and other mechanical features to secure the fastener 112 to the socket housing 110 and establish an electrical connection.

Optionally, the socket assembly 106 may include the shoulder portion 142 as shown in FIG. 2. In alternative embodiments, the coupling portion 140 may extend from the leading end 130 directly to the flange portion 122. As shown, the shoulder portion 142 may have an outer diameter $D_3$. The outer diameter $D_3$ may be less than the outer diameter $D_1$ of the flange portion 122, but greater than the outer diameter $D_2$. In some embodiments, the shoulder portion 142 is sized and shaped to be similar to the thru-hole 230 (FIG. 7) of the circuit board 104 (FIG. 1) so that the shoulder portion 142 has a tight fit with respect to the circuit board 104. In such cases, an exterior surface 152 of the shoulder portion 142 may electrically connect to conductive material that is plated along the inner walls of the thru-hole.

As shown in FIG. 2, the fastener 112 has a mating surface 154 that faces in a direction along the central axis 190. The mating surface 154 and the mating surface 146 face each other (i.e., oppose each other) in opposite directions along the central axis 190. The mating surfaces 154 and 146 may be separated by an adjustable separation distance $SD_1$. In the illustrated embodiment, as the fastener 112 is rotated about the central axis 190, the fastener 112 advances toward the flange portion 122 thereby reducing the separation distance $SD_1$. Also in the illustrated embodiment, the mating surface 154 comprises a conductive material and is configured to make intimate contact with the circuit board 104 (FIG. 1) to establish an electrical connection therebetween.

Figure 3:
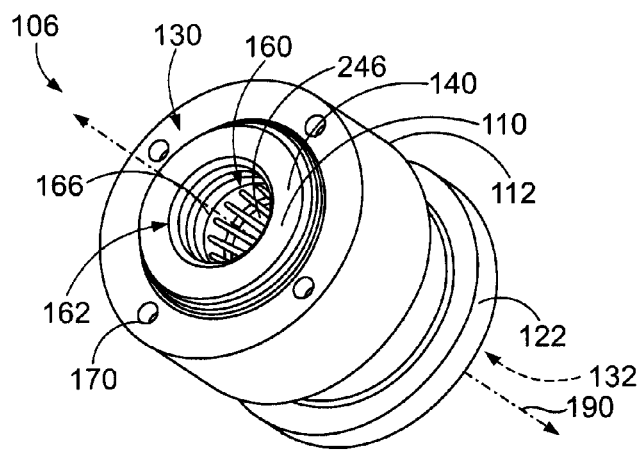
FIG. 3 is a perspective view of a leading end of the socket assembly shown in FIG. 2.
Figure 4:
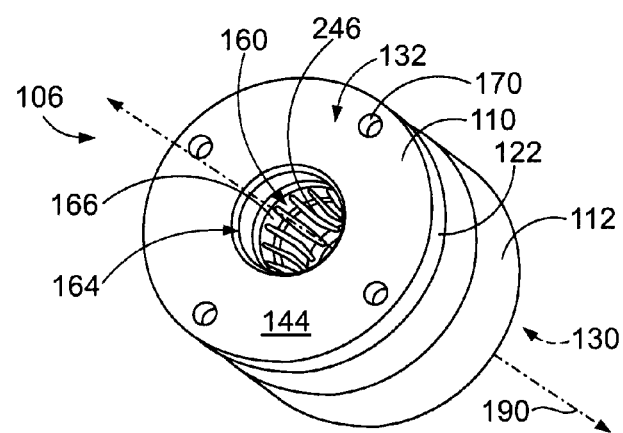
FIG. 4 is a perspective view of a trailing end of the socket assembly shown in FIG. 2.

FIGS. 3 and 4 illustrate different perspective views of the socket assembly 106. As shown, the socket housing 110 and the fastener 112 are substantially cylindrical components. However, in alternative embodiments, the socket housing 110 and the fastener 112 may have other geometries provided that the socket housing 110 and the fastener 112 may be secured to each other and establish one or more conductive pathways as described herein. The socket housing 110 includes a contact cavity 160 that extends between the leading and trailing ends 130 and 132. The contact cavity 160 extends through the coupling and flange portions 140 (FIG. 2) and 122. The central axis 190 extends through a center of the contact cavity 160.

In the illustrated embodiment, the contact cavity 160 extends entirely between the leading and trailing ends 130 and 132. The contact cavity 160 has a cavity opening 162 (FIG. 3) at the leading end 130 and a cavity opening 164 (FIG. 4) at the trailing end 132. The cavity opening 164 may be sized and shaped to receive the power contact 114 (FIG. 1). Furthermore, in the illustrated embodiment, at least one of the cavity openings 162 and 164 is configured to receive a socket contact 166 so that the socket contact 166 may be positioned within the contact cavity 160. In alternative embodiments, the cavity opening 162 is not required and the socket contact 166 and the power contact 114 enter the contact cavity 160 through the cavity opening 164.

As shown in FIG. 4, the terminating surface 144 of the flange portion 122 extends along a plane that is perpendicular to the central axis 190. As such, the terminating surface 144 may constitute the trailing end 132 of the socket housing 110. More specifically, the terminating surface 144 may be configured to engage or interface with another component, such as the power contact 114 (FIG. 1), when the circuit board assembly 100 (FIG. 1) is fully constructed. Also shown in FIGS. 3 and 4, the flange portion 122 and the fastener 112 may include engagement holes 170 that are configured to engage a tool for assembling the socket assembly 106.

Figure 5:
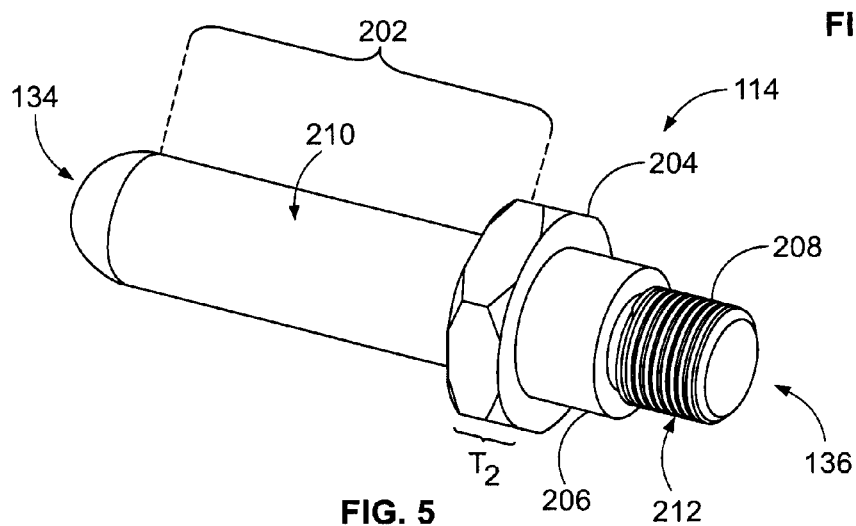
FIG. 5 is a perspective view of a power contact that may be used with the circuit board assembly shown in FIG. 1.

FIG. 5 is a perspective view of the power contact 114. The power contact 114 has an elongated shape that extends lengthwise between the insert and terminal ends 134 and 136. The insert end 134 may be shaped to facilitate mating the power contact 114 with the socket assembly 106 (FIG. 1). For example, the insert end 134 may be rounded or dome-shaped. The power contact 114 also includes a shaft portion 202, the mounting feature 204, an engagement portion 206, and a coupling feature 208. The shaft portion 202 extends lengthwise to the insert end 134 and comprises a contact surface 210. The contact surface 210 is sized and shaped relative to the socket contact 166 (FIG. 3) in order to establish an electrical connection. The mounting feature 204 projects radially away from the contact surface 210 and has a thickness $T_2$. The coupling feature 208 may include outwardly-facing threads 212 that are configured to engage complementary threads (not shown) of the fastener 116 (FIG. 1).

Figure 6:
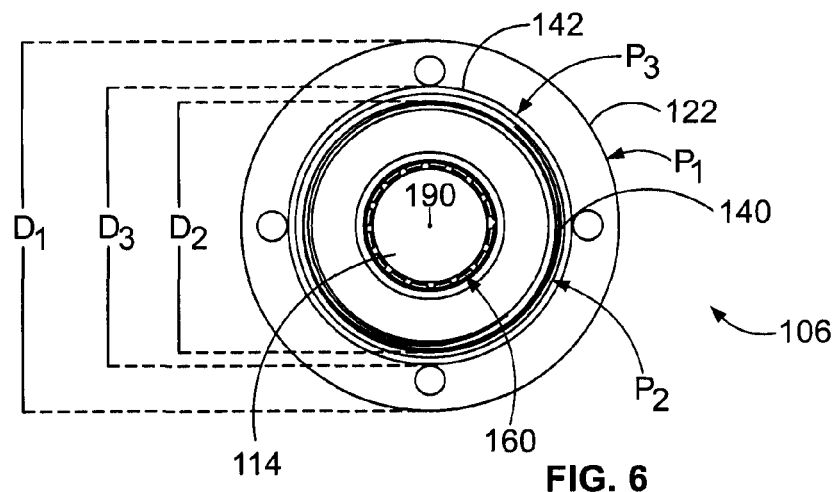
FIG. 6 is a plan view of the leading end of the socket assembly when the power contact and the socket assembly are engaged.

FIG. 6 is a plan view of the socket assembly 106 when the power contact 114 is inserted into the contact cavity 160. As shown, the socket assembly 106 may have different outer perimeters or peripheral contours $P_1$-$P_3$ that extend about the central axis 190. More specifically, the flange portion 122 has the peripheral contour $P_1$ having dimensions that include the diameter $D_1$, the coupling portion 140 has the peripheral contour $P_2$ having dimensions that include the diameter $D_2$, and the shoulder portion 142 has the peripheral contour $P_3$ having dimensions that include the diameter $D_3$. The peripheral contours $P_1$-$P_3$ are sized and shaped relative to the thru-hole 230 (FIG. 7) of the circuit board 104 (FIG. 1). In particular embodiments, the peripheral contour $P_2$ of the coupling portion 140 has dimensions that permit the coupling portion 140 to be inserted through the thru-hole 230 and the peripheral contour $P_1$ of the flange portion 122 has dimensions that prevent the flange portion 122 from advancing through the thru-hole 230. The peripheral contour $P_3$ of the shoulder portion 142 has a different size and shape than the sizes and shapes of the peripheral contours $P_1$ and $P_2$. The peripheral contour $P_3$ may have a size and shape that is similar to the size and shape of the thru-hole 230 so that the shoulder portion 142 forms a snug or tight fit with the thru-hole 230.

In the illustrated embodiment, the peripheral contours $P_1$-$P_3$ are substantially circular. However, in alternative embodiments, the peripheral contours may have other geometries provided that the socket assembly 106 may function and provide conductive pathway(s) as described herein. For example, the coupling portion 140 may have a square-shaped peripheral contour with a diagonal that is less than a diameter $D_4$ (FIG. 7) of the thru-hole 230. Furthermore, the shoulder portion 142 may have a non-circular shape.

Figure 7:
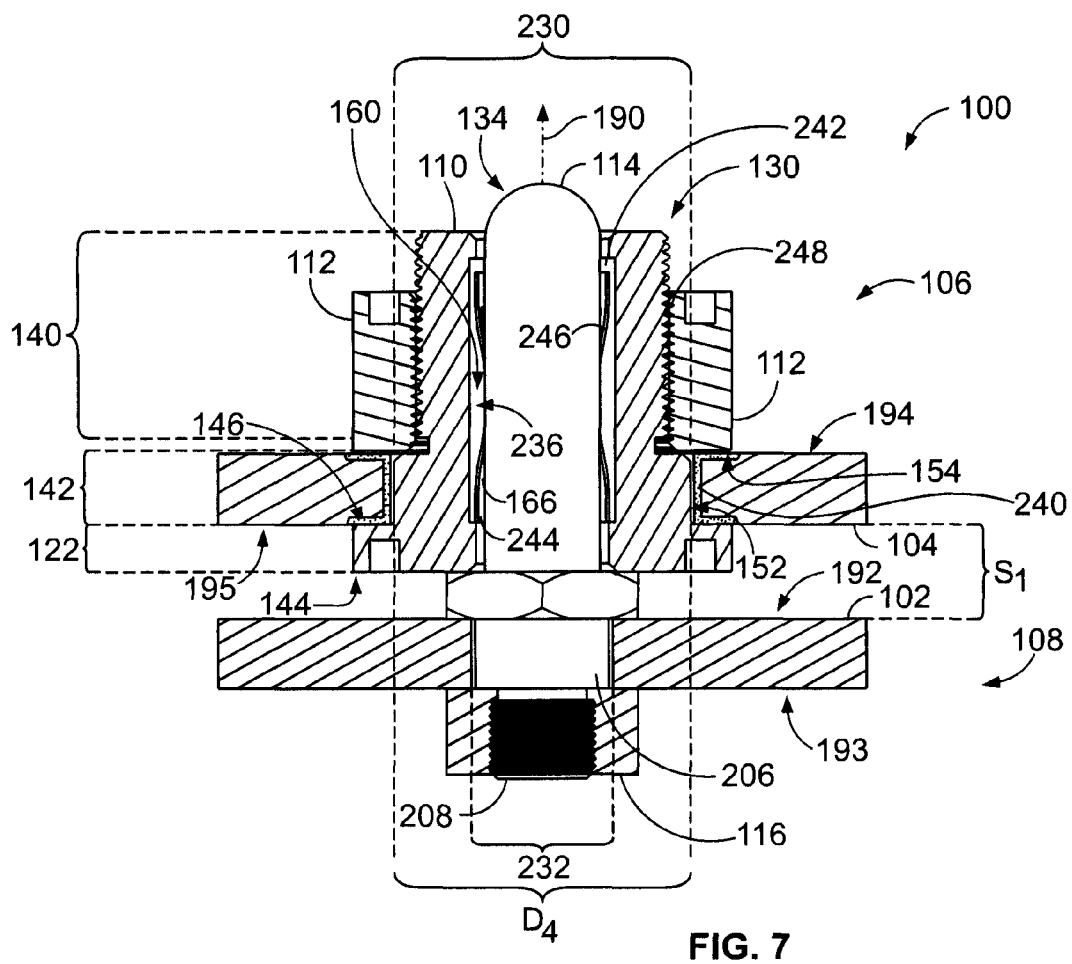
FIG. 7 is a side cross-section of the circuit board assembly of FIG. 1 when engaged with a power contact assembly.

FIG. 7 is a side view of the circuit board assembly 100 illustrating a cross-section of the socket assembly 106. To provide the contact assembly 108, the engagement portion 206 of the power contact 114 is inserted through a thru-hole 232 of the circuit board 102 and advanced in a direction from the board surface 192 to the board surface 193. The coupling feature 208 of the power contact 114 projects beyond the board surface 193 so that the fastener 116 may couple thereto. In the illustrated embodiment, the fastener 116 and the coupling feature 208 couple to each other through a threaded mechanism similar to the fastener 112 and the socket housing 110. However, in alternative embodiments, other coupling mechanisms may be used.

To provide the socket assembly 106, the leading end 130 of the socket housing 110 is advanced through the thru-hole 230 of the circuit board 104. As described above, the coupling portion 140 is sized and shaped relative to the size and shape of the thru-hole 230 to permit the coupling portion 140 to move therethrough. Subsequently, the shoulder portion 142 enters the thru-hole 230. As the coupling and shoulder portion 140 and 142 move through the thru-hole 230, the mating surface 146 of the flange portion 122 approaches the board surface 195 of the circuit board 104. In the illustrated embodiment, the mating and board surfaces 146 and 195 directly contact each other so that electrical current may be transmitted therebetween. In such embodiments, the terminating surface 144 is located a distance away from the board surface 195 that is equal to the thickness $T_1$ (FIG. 2) of the flange portion 122. For example, the terminating surface 144 may be less than about 0.12 inches away from the circuit board 104 or, more particularly, less than about 0.10 inches away or less than about 0.07 inches away.

After inserting the socket housing 110 through the thru-hole 230, the fastener 112 may be secured to the coupling portion 140 of the socket housing 110. The mating surface 154 of the fastener 112 may approach and engage the board surface 194. The fastener 112 presses the circuit board 104 against the mating surface 146 of the flange portion 122. As such, the socket assembly 106 may grip the circuit board 104 between the mating surfaces 154 and 146. When the circuit board 104 is gripped by the socket assembly 106, the socket housing 110 may have a fixed position with respect to the circuit board 104.

Embodiments described herein may establish one or more electrical connections between the socket assembly 106 and the circuit board 104. For example, in the illustrated embodiment, the mating surfaces 154 and 146 comprise a conductive material. Likewise, the board surface 195 may include a conductive material (indicated by a dark shading along the board surface 195) thereon where the board surface 195 interfaces with the mating surface 146, and the board surface 194 may include a conductive material thereon where the board surface 194 interfaces with the mating surface 154. Furthermore, in some embodiments, the shoulder portion 142 may form a snug or interference fit with an inner wall 240 that defines the thru-hole 230 due to the relative sizes and shapes of the thru-hole 230 and the shoulder portion 142. In such embodiments, the inner wall 240 may include a conductive material (e.g., plated along the inner wall 240) and the shoulder portion 142 may also include a conductive material along the exterior surface 152. As such, in the illustrated embodiment, one or more electrical connections may be established between the mating surface 154 and the board surface 194, the mating surface 146 and the board surface 195, and the exterior surface 152 and the inner wall 240.

To electrically engage the contact assembly 108 and the socket assembly 106, the insert end 134 of the power contact 114 may be advanced toward the cavity opening 164 (FIG. 4). As shown, the socket housing 110 has an interior surface 236 that defines the contact cavity 160. The socket contact 166 may be disposed within the contact cavity 160 and electrically connected to the socket housing 110 along the interior surface 236. The socket contact 166 is configured to electrically engage the power contact 114 when the power contact 114 is inserted into the contact cavity 160 in a direction along the central axis 190. In particular embodiments, the socket contact 166 includes opposite end portions 242 and 244 and a plurality of resilient spring elements 246 that extend generally along the central axis 190 between the end portions 242 and 244. (The spring elements 246 are also shown in the contact cavity 160 in FIGS. 3 and 4.) The spring elements 246 may be evenly distributed about the central axis 190.

As show in FIG. 7, each of the spring elements 246 may curve or bend radially inward toward the central axis 190. In such embodiments, the spring elements 246 may engage the contact surface 210 (FIG. 5) of the power contact 114 when the power contact 114 is inserted into the contact cavity 160. When the spring elements 246 engage the power contact 114, the spring elements 246 are deflected in a radial direction away from the central axis 190. The spring elements 246 may provide a radially-inward biasing force so that sufficient contact between the power contact 114 and the spring elements 246 is maintained. In addition to the above, the curved shape of the spring elements 246 and the shape of the insert end 134 of the power contact 114 may facilitate directing or aligning the power contact 114 when the power contact 114 is inserted into the socket contact 166 in a misaligned manner.

When the circuit board assembly 100 is fully constructed, one or more conductive paths between the power contact 114 and at least one of the board surfaces 194 and 195 may exist. For example, conductive paths may exist through at least one of the mating surfaces 154 and 146. In particular embodiments, a conductive path between the power contact 114 and the circuit board 104 may exist through each of the mating surfaces 154 and 146. Furthermore, in some embodiments, a conductive path may exist between the exterior surface 152 of the shoulder portion 142 and the thru-hole 230.

In the illustrated embodiment, when the circuit board assembly 100 is fully constructed, the circuit boards 102 and 104 are positioned immediately adjacent to each other and have the stack spacing $S_1$ therebetween. The circuit boards 102 and 104 may extend parallel to each other. The stack spacing $S_1$ measured between the board surfaces 195 and 192 may be substantially equal to a sum of the thicknesses $T_1$ (FIG. 2) and $T_2$ (FIG. 5). Accordingly, the circuit board assembly 100 may have a stack spacing $S_1$ that is shorter than stack spacings or heights of known connector assemblies. Moreover, the socket and contact assemblies 106 and 108 may deliver power between the circuit boards 102 and 104.

Although the illustrated embodiments are described with reference to electrically interconnecting circuit boards, the description herein is not intended to be limited to circuit boards. Embodiments described herein may also be used to interconnect other electrical components. Furthermore, it is to be understood that the above description is intended to be illustrative, and not restrictive. In addition, the above-described embodiments (and/or aspects or features thereof) may be used in combination with each other. Furthermore, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means—plus-function format and are not intended to be interpreted based on 35 U.S.C. §112, sixth paragraph, unless and until such claim limitations expressly use the phrase "means for" followed by a statement of function void of further structure.

What is claimed is:

1. An electrical socket assembly configured to transmit power between a circuit board and a power contact, the socket assembly comprising:

a socket housing comprising coupling and flange portions and having a contact cavity that extends through the coupling and flange portions along a central axis, the socket housing having a socket contact in the contact cavity that is configured to electrically engage the power contact when received by the contact cavity, the coupling and flange portions having different peripheral contours that extend about the central axis, the peripheral contour of the coupling portion being sized and shaped to permit the coupling portion to be inserted through a thru-hole of the circuit board, the peripheral contour of the flange portion being sized and shaped to prevent the flange portion from advancing through the thru-hole of the circuit board; and a fastener configured to be secured to the coupling portion, the fastener and the flange portion having respective mating surfaces that face each other in opposite directions along the central axis, the mating surfaces being configured to grip the circuit board therebetween such that the socket housing has a fixed position with respect to the circuit board, wherein the socket housing includes a conductive path that extends through the socket housing between the power contact and the circuit board and transmits power to or from the circuit board.

2. The socket assembly in accordance with claim 1, wherein the mating surface of the fastener is configured to press the circuit board against the mating surface of the flange portion to grip the circuit board therebetween.

3. The socket assembly in accordance with claim 1, wherein the flange portion also has a terminating surface that faces away from the circuit board, the terminating surface constituting a trailing end of the socket housing.

4. The socket assembly in accordance with claim 1, wherein the socket housing has an interior surface that defines the contact cavity, the socket contact being electrically connected to the socket housing along the interior surface and being configured to electrically engage the power contact when inserted into the contact cavity.

5. The socket assembly in accordance with claim 4, wherein the socket contact comprises a plurality of resilient spring elements that extend generally along the central axis, the spring elements being deflected in a radial direction away from the central axis when the spring elements engage the power contact.

6. The socket assembly in accordance with claim 1, wherein the socket housing further comprises a shoulder portion extending between the flange portion and the coupling portion, the shoulder portion having a peripheral contour that extends about the central axis that is similar in size and shape to the thru-hole of the circuit board, wherein a cross-sectional area of the peripheral contour of the shoulder portion is greater than a cross-sectional area of the peripheral contour of the coupling portion, the cross-sectional areas being taken perpendicular to the central axis.

7. The socket assembly in accordance with claim 1, wherein the coupling portion has an exterior surface with threads that curve about the central axis, the fastener including complementary threads, wherein the threads of the coupling portion are engaged to the threads of the fastener when each of the mating surfaces are pressed against the circuit board and hold the circuit board therebetween.

8. The socket assembly in accordance with claim 1, wherein the socket housing includes a shoulder portion positioned between the coupling and flange portions, the shoulder portion having an exterior surface that is configured to face an inner wall of the thru-hole, wherein the conductive path extends through at least one of the mating surface of the flange portion, the mating surface of the fastener, or the exterior surface of the shoulder portion.

9. The socket assembly in accordance with claim 1, wherein the coupling portion has an exterior surface with threads that curve about the central axis, the fastener having an interior surface with threads that curve about the central axis and that rotatably engage the threads of the coupling portion, wherein the respective threads of the coupling portion and the fastener are located so that the circuit board is compressed by the fastener and flange portion as the respective threads are rotatably engaged.

10. The socket assembly in accordance with claim 1, further comprising the power contact, the power contact being inserted into the contact cavity through the flange portion in a direction that is from the flange portion toward the coupling portion.

11. An electrical socket assembly configured to transmit power between a circuit board and a power contact, the socket assembly comprising:
the circuit board comprising a thru-hole;
a socket housing comprising coupling and flange portions and having a contact cavity that extends through the coupling and flange portions along a central axis, the socket housing having a socket contact in the contact cavity that is configured to electrically engage the power contact when received by the contact cavity, the coupling and flange portions having different peripheral contours that extend about the central axis, the peripheral contour of the coupling portion being sized and shaped to permit the coupling portion to be inserted through the thru-hole of the circuit board, the peripheral contour of the flange portion being sized and shaped to prevent the flange portion from advancing through the thru-hole of the circuit board; and
a fastener configured to be secured to the coupling portion, the fastener and the flange portion having respective mating surfaces that face each other in opposite directions along the central axis, the mating surfaces being configured to grip the circuit board therebetween such that the socket housing has a fixed position with respect to the circuit board, wherein the socket housing includes a conductive path between the power contact and the circuit board, the conductive path transmitting power to or from the circuit board, wherein the circuit board is configured to be gripped between the mating surfaces of the fastener and the flange portion, the circuit board comprising a dielectric material and a conductive material, the conductive material being located around the thru-hole and configured to engage at least one of the socket housing or the fastener, the circuit board receiving power from or transmitting power to the conductive path through the conductive material.

12. The socket assembly in accordance with claim 11, wherein the coupling portion has an exterior surface with threads that curve about the central axis, the fastener having an interior surface with threads that curve about the central axis and that rotatably engage the threads of the coupling portion, wherein the respective threads of the coupling portion and the fastener are located so that the circuit board is compressed by the fastener and flange portion as the respective threads are rotatably engaged.

13. A circuit board assembly comprising:
first and second circuit boards, the second circuit board having a thru-hole;
an elongated power contact configured to be coupled to the first circuit board;
a socket housing comprising coupling and flange portions and having a contact cavity that extends through the coupling and flange portions along a central axis, the coupling and flange portions having different peripheral contours that extend about the central axis, the peripheral contour of the coupling portion being sized and shaped to permit the coupling portion to be inserted through the thru-hole of the second circuit board, the peripheral contour of the flange portion being sized and shaped to prevent the flange portion from advancing through the thru-hole of the second circuit board; and
a fastener configured to be secured to the coupling portion, the fastener and the flange portion having respective mating surfaces that face each other in opposite directions along the central axis, the mating surfaces being configured to grip the second circuit board therebetween such that the socket housing has a fixed position with respect to the second circuit board;
wherein the socket housing has a socket contact in the contact cavity and includes a conductive path, the conductive path extending between the first and second circuit boards through the power contact and the socket housing when the power contact is inserted into the contact cavity and electrically engaged to the socket contact, the first and second circuit boards extending substantially parallel to each other and having a stack spacing therebetween.

14. The circuit board assembly in accordance with claim 13 wherein the stack spacing is less than about .20 inches.

15. The circuit board assembly in accordance with claim 13 wherein the fastener is a first fastener and the circuit board assembly further comprises a second fastener, the second fastener coupling the power contact to the first circuit board.

16. The circuit board assembly in accordance with claim 13, wherein at least one of the mating surfaces that grip the second circuit board is configured to directly contact a conductive material on the second circuit board to provide the conductive path.

17. The circuit board assembly in accordance with claim 13, wherein the second circuit board has opposite board surfaces and each of the mating surfaces directly contacts a corresponding one board surface of the second circuit board, the mating surface of the fastener pressing the second circuit board against the mating surface of the flange portion to grip the second circuit board therebetween.

18. The circuit board assembly in accordance with claim 13, wherein the socket housing has an interior surface that defines the contact cavity, the socket contact being electrically connected to the socket housing along the interior surface and being configured to electrically engage the power contact when inserted into the contact cavity.

19. The circuit board assembly in accordance with claim 18, wherein the socket contact comprises a plurality of resilient spring elements that extend generally along the central axis, the spring elements being deflected in a radial direction away from the central axis when the spring elements engage the power contact.

20. The socket assembly in accordance with claim 13, wherein the second circuit board includes a dielectric material and a conductive material, the conductive material being located around the thru-hole and configured to engage at least one of the socket housing or the fastener, the second circuit board receiving power from or transmitting power to the conductive path through the conductive material.

* * * * *